(12) United States Patent
Tajima et al.

(10) Patent No.: US 11,333,700 B2
(45) Date of Patent: May 17, 2022

(54) INSPECTION APPARATUS OF SEMICONDUCTOR DEVICE AND METHOD FOR INSPECTING SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Jumpei Tajima, Mitaka (JP); Jongil Hwang, Yokohama (JP); Shinya Nunoue, Ichikawa (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 215 days.

(21) Appl. No.: 16/799,980

(22) Filed: Feb. 25, 2020

(65) Prior Publication Data
US 2020/0341048 A1    Oct. 29, 2020

(30) Foreign Application Priority Data
Apr. 25, 2019    (JP) .............................. JP2019-084288

(51) Int. Cl.
   *G01R 31/26*    (2020.01)
(52) U.S. Cl.
   CPC ..... *G01R 31/2601* (2013.01); *G01R 31/2607* (2013.01)

(58) Field of Classification Search
   CPC .... G01R 31/26; G01R 1/06727; G01R 1/067; G01R 1/0491; G01R 31/265;
   (Continued)

(56) References Cited

U.S. PATENT DOCUMENTS 9,871,108 B2    1/2018  Tanaka et al.
2002/0178800 A1*  12/2002  Hasegawa .............. G01Q 60/40
                                                                73/105

(Continued)

FOREIGN PATENT DOCUMENTS

JP    2004-146431 A    5/2004
JP    2010-109156 A    5/2010
(Continued)

*Primary Examiner* — Jermele M Hollington
*Assistant Examiner* — Courtney G McDonnough
(74) *Attorney, Agent, or Firm* — Oblon, McClelland, Maier & Neustadt, L.L.P.

(57) ABSTRACT

According to one embodiment, an inspection apparatus of a semiconductor device includes a first probe configured to contact a first portion of the semiconductor device, a conductive member configured to oppose a second portion of the semiconductor device, and a detector configured to apply a first voltage between the semiconductor device and the first probe, to apply a conductive member voltage between the semiconductor device and the conductive member, and to detect a current flowing in the first probe. The first voltage has a first polarity of one of positive or negative when referenced to a potential of the semiconductor device. The conductive member voltage has a second polarity of the other of positive or negative when referenced to the potential of the semiconductor device.

16 Claims, 8 Drawing Sheets

(58) Field of Classification Search
CPC ........ G01R 31/318511; G01R 1/07307; G01R 1/07342; G01R 1/07385; G01R 1/36; G01R 3/00; G01R 31/2601; G01R 31/2889; G01R 31/2642; G01R 31/2648; G01R 31/2607; G01R 31/2831; G01R 31/31702; G01Q 60/00; G01Q 30/02; G01Q 60/40; G01Q 70/00; H01L 29/0642; H01L 29/207; H01L 29/7786; H01L 29/2003
USPC .................................................... 324/762.05
See application file for complete search history.

(56) References Cited

U.S. PATENT DOCUMENTS

| | | | |
|---|---|---|---|
| 2004/0155240 A1* | 8/2004 | Howland | G01R 31/2831 257/48 |
| 2013/0234151 A1 | 9/2013 | Hikosaka et al. | |
| 2014/0055783 A1 | 2/2014 | Yanase et al. | |
| 2016/0260835 A1* | 9/2016 | Yamazaki | H01L 29/0684 |
| 2019/0385846 A1* | 12/2019 | Fukuhara | H01L 29/2003 |

FOREIGN PATENT DOCUMENTS

| | | |
|---|---|---|
| JP | 2013-187427 A | 9/2013 |
| JP | 5765861 B2 | 8/2015 |
| JP | 5837465 B2 | 12/2015 |
| JP | 5953712 B2 | 7/2016 |
| JP | 2016-143780 A | 8/2016 |
| JP | 2016-208029 A | 12/2016 |
| JP | 2018-142563 A | 9/2018 |
| JP | 2019-201158 A | 11/2019 |

* cited by examiner

INSPECTION APPARATUS OF SEMICONDUCTOR DEVICE AND METHOD FOR INSPECTING SEMICONDUCTOR DEVICE

CROSS-REFERENCE TO RELATED APPLICATIONS

This application is based upon and claims the benefit of priority from Japanese Patent Application No. 2019-084288, filed on Apr. 25, 2019; the entire contents of which are incorporated herein by reference.

FIELD

Embodiments described herein relate generally to an inspection apparatus of a semiconductor device and a method for inspecting the semiconductor device.

BACKGROUND

For example, there is a semiconductor device that uses a nitride semiconductor. An efficient inspection of the semiconductor device is desirable.

DETAILED DESCRIPTION

According to one embodiment, an inspection apparatus of a semiconductor device includes a first probe configured to contact a first portion of the semiconductor device, a conductive member configured to oppose a second portion of the semiconductor device, and a detector configured to apply a first voltage between the semiconductor device and the first probe, to apply a conductive member voltage between the semiconductor device and the conductive member, and to detect a current flowing in the first probe. The first voltage has a first polarity of one of positive or negative when referenced to a potential of the semiconductor device. The conductive member voltage has a second polarity of the other of positive or negative when referenced to the potential of the semiconductor device.

According to another embodiment, an inspection apparatus of a semiconductor device includes a first probe configured to contact a first portion of the semiconductor device, a conductive member configured to oppose a second portion of the semiconductor device, and an insulating layer. The insulating layer is between the second portion and the conductive member when the conductive member opposes the second portion.

According to another embodiment, a method for inspecting a semiconductor device is disclosed. The method includes using a head part to apply a first voltage between the semiconductor device and a first probe, to apply a conductive member voltage between the semiconductor device and a conductive member, and to detect a current flowing in the first probe. The head part includes the first probe and the conductive member. The first probe is configured to contact a first portion of the semiconductor device. The conductive member is configured to oppose a second portion of the semiconductor device. The first voltage has a first polarity of one of positive or negative when referenced to a potential of the semiconductor device. The conductive member voltage has a second polarity of the other of positive or negative when referenced to the potential of the semiconductor device.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1A:
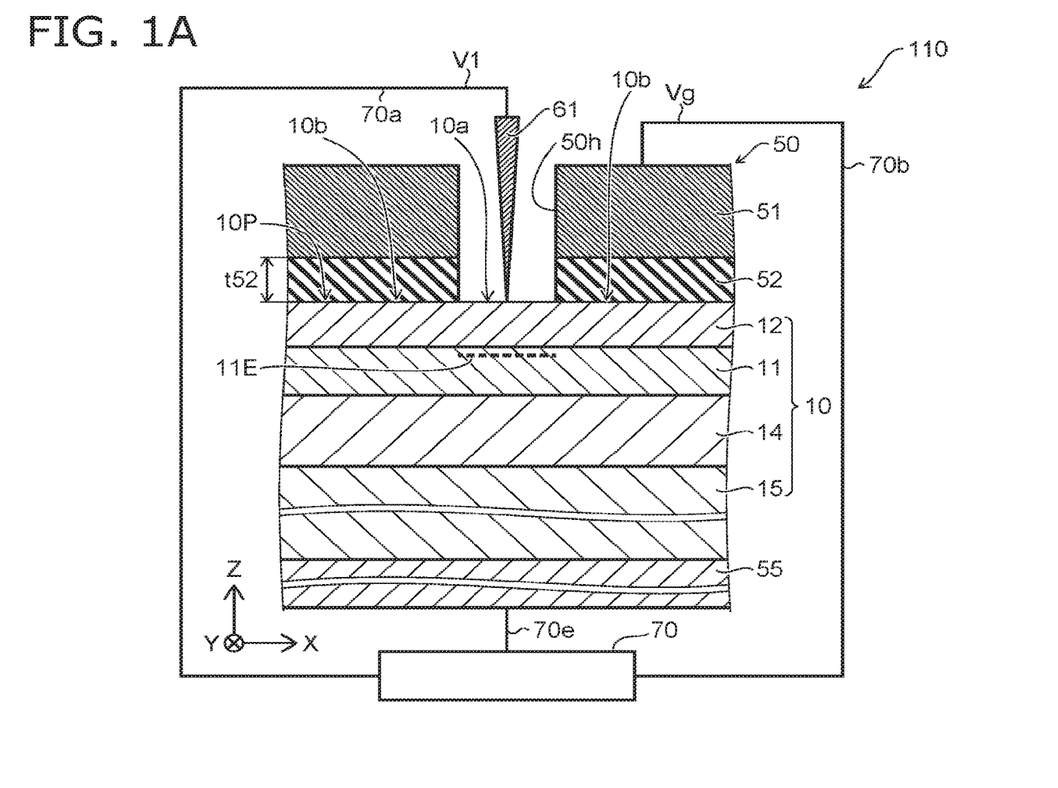
FIG. 1A and FIG. 1B are schematic views illustrating an inspection apparatus of a semiconductor device according to a first embodiment.
Figure 1B:
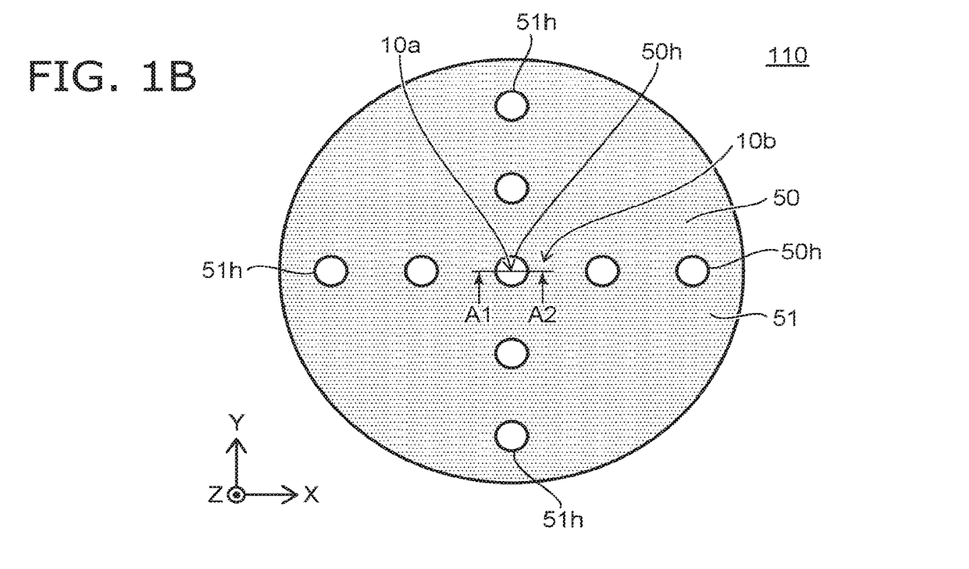

FIG. 1A and FIG. 1B are schematic views illustrating an inspection apparatus of a semiconductor device according to a first embodiment.

FIG. 1A is a line A1-A2 cross-sectional view of FIG. 1B. FIG. 1B is a plan view.

As shown in FIG. 1A, the inspection apparatus 110 of the semiconductor device according to the embodiment includes a first probe 61, a conductive member 51, and a detector 70. The conductive member 51 is at least a portion of a head part 50.

For example, the inspection apparatus 110 may include a stage 55. The semiconductor device 10 is placed on the stage 55. The semiconductor device 10 is an inspection object. The semiconductor device 10 may be a wafer used to form semiconductor devices. Hereinbelow, the inspection object is taken to be the semiconductor device 10 even in the case where the inspection object is a wafer including a semiconductor.

In the example, the semiconductor device 10 includes a first semiconductor layer 11 and a second semiconductor layer 12. The first semiconductor layer 11 includes, for example, $Al_{x1}Ga_{1-x1}N$ ($0 \leq x1 < 1$). The second semiconductor layer 12 includes, for example, $Al_{x2}Ga_{1-x2}N$ ($0 < x2 \leq 1$ and $x1 < x2$). These semiconductor layers may include an impurity controlling the conductivity type, etc.

In the example, the semiconductor device 10 includes a substrate 15 (e.g., a silicon substrate). The semiconductor device 10 may further include an intermediate layer 14. The first semiconductor layer 11 is provided between the substrate 15 and the second semiconductor layer 12. The intermediate layer 14 is provided between the substrate 15 and the first semiconductor layer 11. The intermediate layer 14 includes, for example, AlGaN, etc. The intermediate layer 14 may include, for example, multiple stacked nitride films. The intermediate layer 14 may be, for example, a buffer layer.

For example, a HEMT (High Electron Mobility Transistor) or the like is formed using the wafer of the semiconductor device 10. The semiconductor device 10 is, for example, a HEMT wafer. The description recited above is an example; and the semiconductor device may have another configuration (e.g., a p-n junction, etc.).

The first probe 61 is configured to contact a first portion 10a of the semiconductor device 10. The conductive member 51 is configured to oppose a second portion 10b of the semiconductor device 10.

The first portion 10a and the second portion 10b are included in a first surface 10P of the semiconductor device 10. The first surface 10P is, for example, the upper surface (the front surface portion) of the semiconductor device 10.

The front surface of the stage 55 is taken as an X-Y plane. A direction perpendicular to the X-Y plane is taken as a Z-axis direction. One direction along the X-Y plane is taken as an X-axis direction. A direction that is along the X-Y plane and perpendicular to the X-axis direction corresponds to a Y-axis direction. The first surface 10P is along the X-Y plane.

The detector 70 is electrically connected to the first probe 61. In the example, the detector 70 and the first probe 61 are electrically connected to each other by wiring 70a. The detector 70 is electrically connected to the conductive member 51. In the example, the detector 70 and the conductive member 51 are electrically connected to each other by wiring 70b.

The detector 70 is electrically connected to the semiconductor device 10. In the example, the detector 70 is electrically connected to the stage 55 by wiring 70e. For example, the semiconductor device 10 is electrically connected to the stage 55 by the semiconductor device 10 contacting the stage 55. Or, the semiconductor device 10 is electrically connected to the stage 55 by providing a conductive material (which may be, for example, a liquid, etc.) between the semiconductor device 10 and the stage 55.

The detector 70 applies a first voltage V1 between the semiconductor device 10 and the first probe 61 and applies a conductive member voltage Vg between the semiconductor device 10 and the conductive member 51. Then, the detector 70 detects the current flowing in the first probe 61.

For example, the detector 70 may apply the first voltage V1 between the stage 55 and the first probe 61. For example, the detector 70 may apply the conductive member voltage Vg between the stage 55 and the conductive member 51.

The first voltage V1 has a first polarity when referenced to the potential of the semiconductor device 10. The conductive member voltage Vg has a second polarity when referenced to the potential of the semiconductor device 10. The first polarity is one of positive or negative. The second polarity is the other of positive or negative. In one example, the first polarity is positive; and the second polarity is negative. The potential of the semiconductor device 10 may be, for example, the potential of the stage 55.

For example, in the case where the semiconductor device 10 is a HEMT wafer, a carrier region 11E is formed in the first semiconductor layer 11 at the second semiconductor layer 12 vicinity. The carrier region 11E is, for example, a two-dimensional electron gas. In such a case, the current that flows along the Z-axis direction through the first portion 10a due to the first probe 61 applying the first voltage V1 of the first polarity (e.g., positive) to the first portion 10a is detected. On the other hand, an electric field of the second polarity (e.g., negative) is applied to the second portion 10b when the conductive member 51 applies the conductive member voltage Vg of the second polarity (e.g., negative) to the second portion 10b. The carrier region 11E (e.g., the two-dimensional electron gas) in the second portion 10b disappears. Therefore, a current does not flow in the second portion 10b.

According to the embodiment, the current that flows through the first portion 10a can be detected in a state in which the current flowing in the second portion 10b is suppressed. Thereby, the effects of the second portion 10b, etc., are suppressed; and the desired current can be detected efficiently.

For example, a first reference example may be considered in which the current is detected using the first probe 61 without providing the conductive member 51. In such a case, the carrier region 11E exists in a portion of the semiconductor device 10 having a wide surface area. Therefore, if a large current flows locally at a position (e.g., the position of a defect or the like) somewhere in the wide region, it is difficult to correctly inspect the portions other than the defect or the like.

On the other hand, a second reference example may be considered in which the semiconductor device 10 is patterned into several portions to form multiple independent regions; and the characteristics of each of the multiple regions are measured. The effects of the defect or the like can be small in the second reference example. However, in the second reference example, a process is necessary to pattern the semiconductor device 10 into the several portions.

Conversely, the first probe 61 and the conductive member 51 are provided in the inspection apparatus 110 according to the embodiment. The carrier region 11E disappears in the second portion 10b overlapping the conductive member 51 due to the conductive member voltage Vg applied to the conductive member 51. The effects of the defects or the like which might exist in the carrier region 11E are suppressed thereby. The current that flows through the first portion 10a can be inspected correctly thereby. According to the embodiment, an inspection apparatus of a semiconductor device can be provided in which an efficient inspection can be performed.

For example, the distance between the semiconductor device 10 and the first probe 61 is changeable. The distance between the semiconductor device 10 and the conductive member 51 (or the head part 50) is changeable. These distances are lengths along the Z-axis direction. By causing the distance between the semiconductor device 10 and the first probe 61 to be substantially 0, a current flows in the first portion 10a via the first probe 61. By causing the distance between the semiconductor device 10 and the first probe 61 to become short, an electric field is applied to the second portion 10b. These distances may be modified independently. These distances may be modified in combination.

For example, the relative positions along the Z-axis direction of the first probe 61 and the conductive member 51 are changeable. For example, the height (the position along the Z-axis direction) of the first probe 61 may be changeable in a state in which the conductive member 51 is placed on the first surface 10P of the semiconductor device 10. The tip of the first probe 61 may have a state of contacting the first surface 10P and a state of being separated from the first surface 10P.

As shown in FIG. 1A, the conductive member 51 has a first hole 50h. The first hole 50h is, for example, an opening. The semiconductor device 10 includes a portion corresponding to the opening. The portion that corresponds to the opening corresponds to the first portion 10a. The first probe 61 is configured to contact the first portion 10a via the first hole 50h.

As shown in FIG. 1B, the conductive member 51 may include multiple first holes 50h. In such a case, multiple first portions 10a are provided. For example, the relative positions in the X-Y plane of the first probe 61 and the semiconductor device 10 may be changeable. For example, the modification of the relative positions can be performed by an X-Y stage, etc. For example, the first probe 61 may be configured to contact the multiple first portions 10a respectively via the multiple first holes 50h by modifying the position of the first probe 61.

Multiple first probes 61 may be provided in the embodiment. One of the multiple first probes 61 may be configured to contact one of the multiple first portions 10a via one of the multiple first holes 50h.

The width (the length along one direction along the X-Y plane) of the first hole 50h is, for example, not less than 100 μm and not more than 1 mm. The configuration of the first hole 50h is arbitrary and is circular, polygonal, etc.

In one example, the first voltage V1 is +1000 V. The conductive member voltage Vg is −30 V. These values are examples and may be modified to match the characteristics of the semiconductor device of the inspection object.

For example, in the case where the semiconductor device is a HEMT wafer and the carrier region 11E is a two-dimensional electron gas, the first voltage V1 is positive; and the conductive member voltage Vg is negative. Thereby, the carrier region 11E disappears in the second portion 10b where the conductive member voltage Vg is applied.

For example, in the case where the carrier region 11E is a two-dimensional hole gas, the first voltage V1 is negative; and the conductive member voltage Vg is positive. Thereby, the carrier region 11E disappears in the second portion 10b where the conductive member voltage Vg is applied. For example, the carrier region 11E includes a two-dimensional hole gas in the case where the first semiconductor layer 11 includes $Al_{x1}Ga_{1-x1}N$ (0<x1≤1) and the second semiconductor layer 12 includes $Al_{x2}Ga_{1-x2}N$ (0≤x1<1 and x2<x1).

For example, the first voltage V1 is negative and the conductive member voltage Vg is positive in the case where the semiconductor device 10 includes a p-n junction, the first semiconductor layer is of the p-type, and the second semiconductor layer is of the n-type.

In the case where the front surface of the second portion 10b is insulative in the description recited above, an electric field is applied to the second portion 10b substantially without a current flowing in the second portion 10b when the conductive member voltage Vg is applied to the second portion 10b. Thereby, the carrier region 11E in the second portion 10b disappears.

In the case where the front surface of the second portion 10b is conductive, an electric field can be applied to the second portion 10b substantially without a current flowing in the second portion 10b by electrically insulating between the conductive member 51 and the second portion 10b.

In the embodiment, the portion of the conductive member 51 corresponding to the second portion 10b may be insulative. Or, an insulating layer 52 may be provided.

The inspection apparatus 110 may further include the insulating layer 52 illustrated in FIG. 1A. The insulating layer 52 is between the second portion 10b and the conductive member 51 when the conductive member 51 opposes the second portion 10b. For example, the conductive member 51 and the insulating layer 52 are included in the head part 50.

By providing the insulating layer 52, even in the case where the front surface of the second portion 10b is conductive, the electric field can be applied to the second portion 10b substantially without a current flowing in the second portion 10b.

A thickness t52 of the insulating layer 52 is, for example, not less than 5 nm and not more than 500 nm (referring to FIG. 1A). Thereby, the electric field that corresponds to the conductive member voltage Vg can be applied effectively to the second portion 10b. The thickness t52 may be, for example, not less than 10 nm and not more than 100 nm. The thickness is the length along the Z-axis direction.

In the embodiment, the conductive member 51 may include, for example, silicon or a metal. The insulating layer 52 may include, for example, an oxide of an element (e.g., silicon or a metal) included in the conductive member 51, a nitride of the element, an oxynitride of the element, etc. For example, the conductive member 51 includes silicon; and the insulating layer includes silicon oxide. Stable insulative properties are obtained easily.

Figure 2:
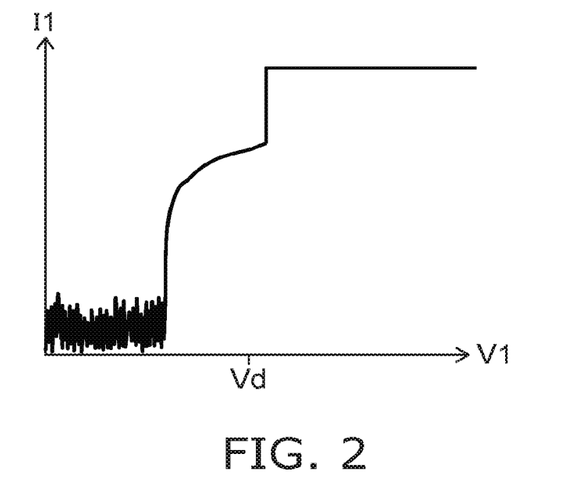
FIG. 2 is a graph illustrating an inspection characteristic of the semiconductor device.

FIG. 2 is a graph illustrating an inspection characteristic of the semiconductor device.

FIG. 2 illustrates measurement results when the semiconductor device 10 is a HEMT wafer. The horizontal axis of FIG. 2 is the first voltage V1. The vertical axis is a current I1 flowing in the first probe 61. As the first voltage V1 is increased as shown in FIG. 2, the current I1 increases abruptly at a voltage Vd. Such a voltage Vd corresponds to the breakdown voltage of the semiconductor device 10.

In the embodiment, the detector 70 may detect the current I1 while changing the absolute value of the first voltage V1. By measuring such a voltage-current characteristic, the characteristics (the breakdown voltage, etc.) of the semiconductor device 10 can be inspected more accurately.

Figure 3:
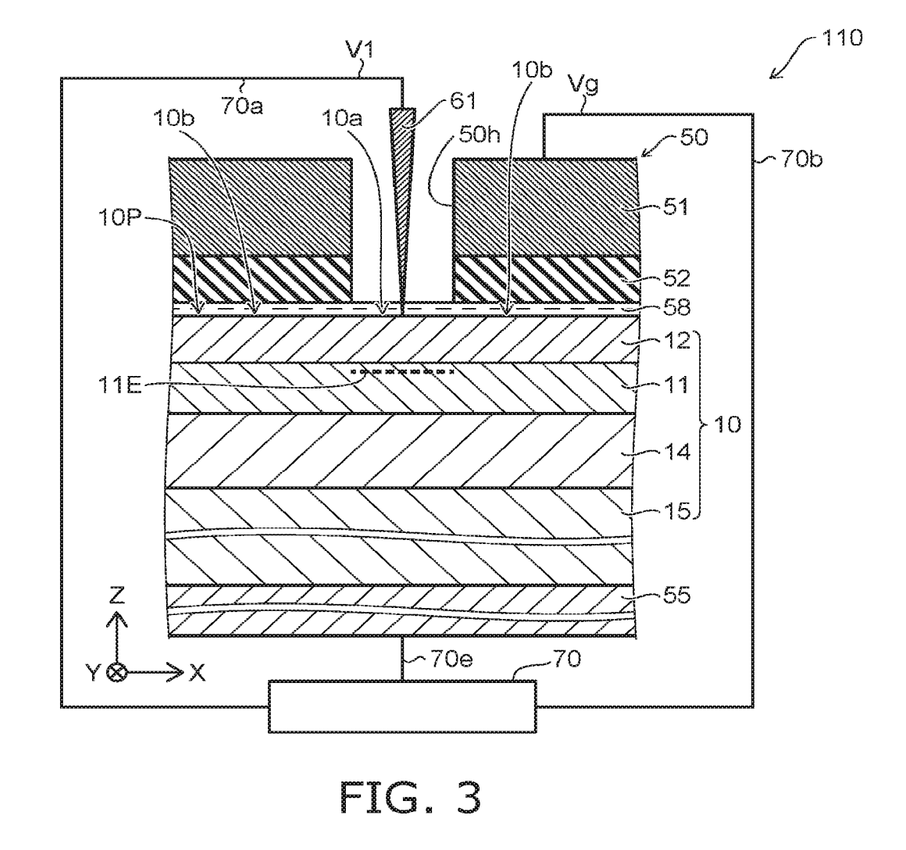
FIG. 3 is a schematic view illustrating an inspection state of the inspection apparatus of the semiconductor device according to the first embodiment.

FIG. 3 is a schematic view illustrating an inspection state of the inspection apparatus of the semiconductor device according to the first embodiment.

When inspecting as shown in FIG. 3, a liquid 58 may be provided between the head part 50 and the first surface 10P of the semiconductor device 10. The liquid 58 is insulative. The volume resistivity of the liquid 58 is, for example, not less than $1 \times 10^6$ Ωm and not more than $1 \times 10^{15}$ Ωm. The liquid 58 includes, for example, at least one selected from the group consisting of silicone and a fluorine-based inert liquid, etc. The fluorine-based inert liquid includes, for example, at least one selected from the group consisting of PFC (per-fluoro carbon) and PFPE (perfluoropolyether). By using the liquid 58, for example, shorts between the head part 50 and the semiconductor device 10 in a high-humidity environment can be suppressed. For example, shorts between the head part 50 and the first probe 61 in a high-humidity environment can be suppressed. By using the liquid 58, a stable electric field can be applied to the second portion 10b. The insulating layer 52 can be omitted if the distance between the head part 50 and the semiconductor device 10 can be maintained appropriately.

The liquid 58 may be provided as necessary and may be omitted. States in which the liquid 58 is provided are illustrated in the drawings described below. In the drawings described below, the detector 70 (referring to FIG. 1A, etc.) is omitted as appropriate.

Figure 4A:
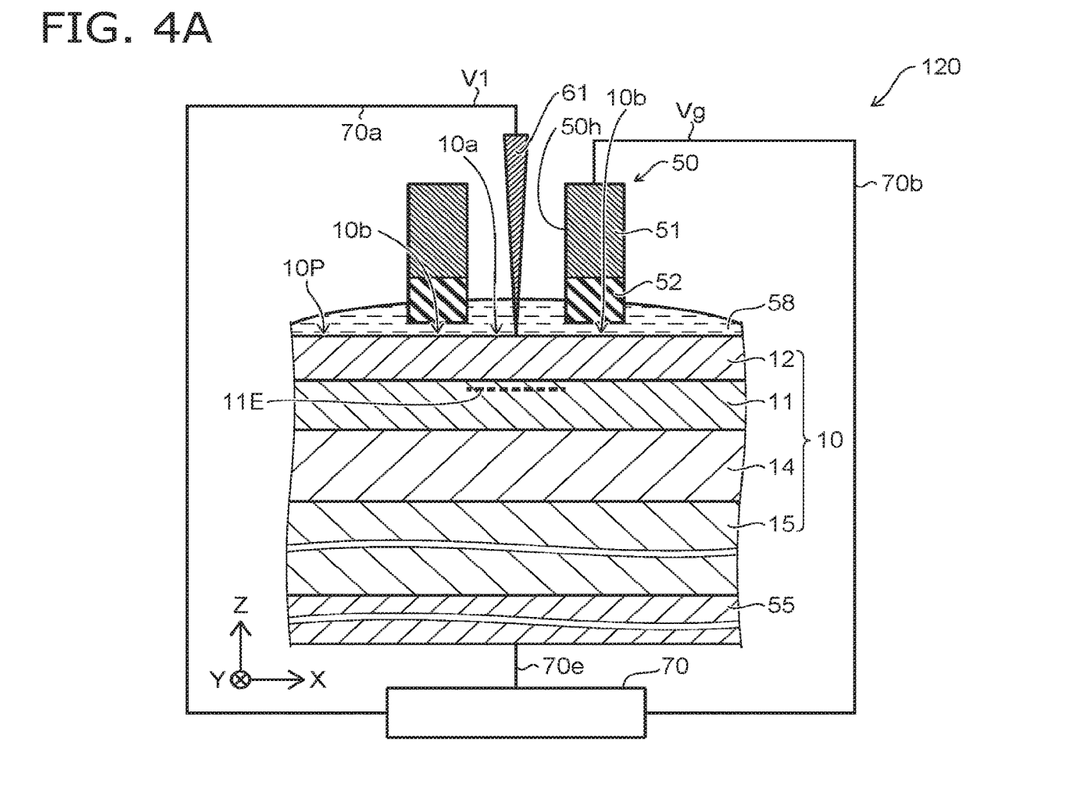
FIG. 4A and FIG. 4B are schematic views illustrating an inspection apparatus of a semiconductor device according to the first embodiment.
Figure 4B:
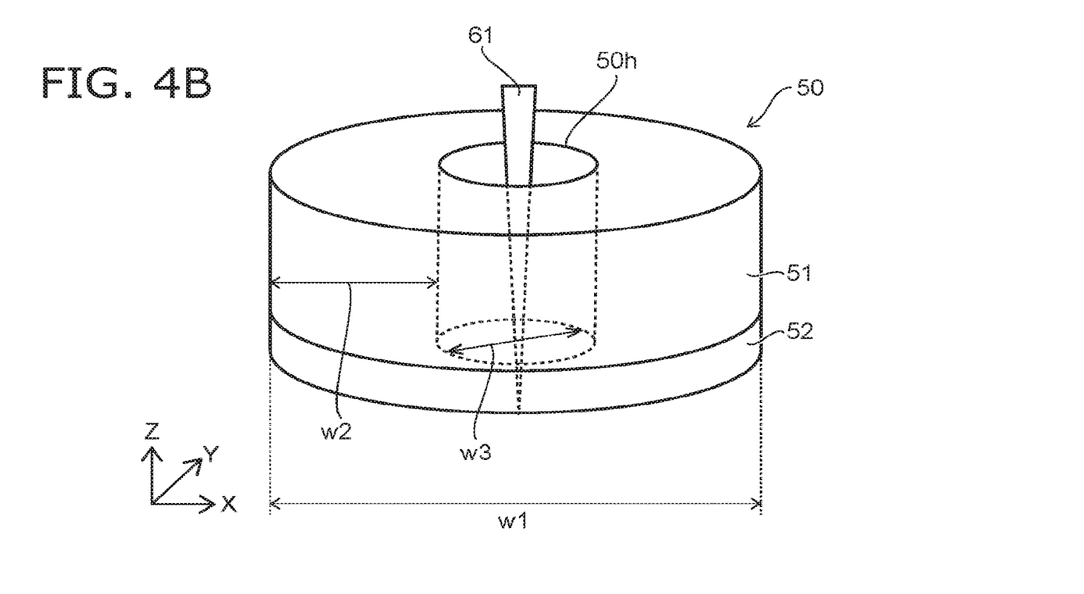

FIG. 4A and FIG. 4B are schematic views illustrating an inspection apparatus of a semiconductor device according to the first embodiment.

FIG. 4A is a cross-sectional view. FIG. 4B is a perspective view illustrating an enlarged portion of the inspection apparatus.

As shown in FIG. 4A, compared to the size of the semiconductor device 10 in the inspection apparatus 120, the size of the conductive member 51 is smaller than the size of the semiconductor device 10. In such a case, the first probe 61 may be moved together with the conductive member 51. The characteristics can be inspected at the desired position of the first surface 10P of the semiconductor device 10.

When the first probe 61 is moved together with the conductive member 51, the head part 50 may be considered to include the first probe 61. For example, the relative positions of the semiconductor device 10 and the head part 50 including the first probe 61 and the conductive member 51 are changeable along the first surface 10P. As described above, the first surface 10P is, for example, the upper surface of the semiconductor device 10.

FIG. 4B illustrates an enlargement of the head part 50. A width w1 of the conductive member 51 (or the head part 50) is, for example, not less than 2 mm and not more than 5 mm. A width w3 of the first hole 50h is, for example, not less than 100 µm and not more than 1 mm. A width w2 of the portion of the conductive member 51 (or the head part 50) other than the first hole 50h is, for example, not less than 1 mm and not more than 2 mm. The widths w1 to w3 are lengths along one direction along the X-Y plane.

Figure 5:
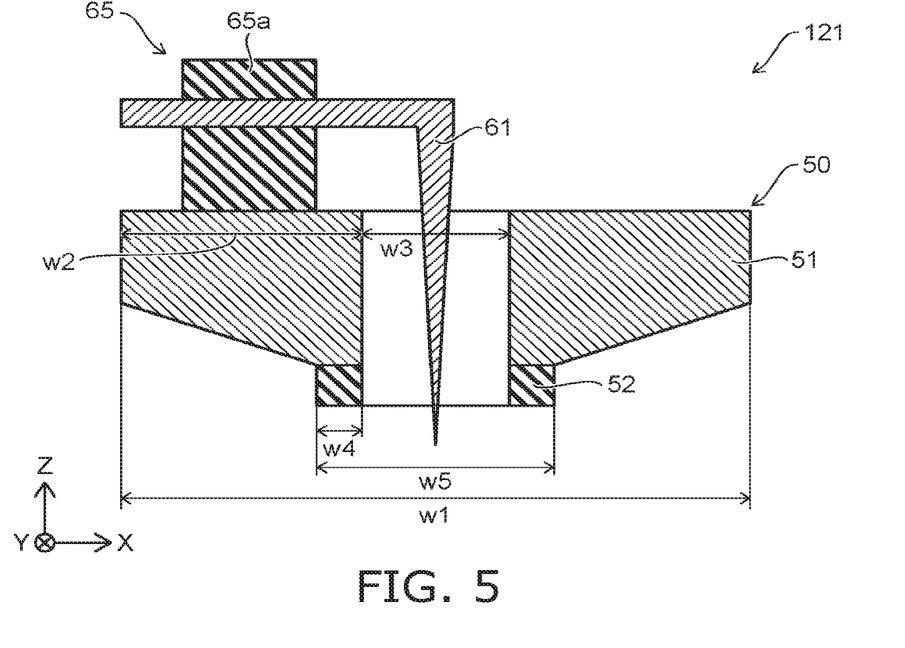
FIG. 5 is a schematic cross-sectional view illustrating a portion of an inspection apparatus of a semiconductor device according to the first embodiment.

FIG. 5 is a schematic cross-sectional view illustrating a portion of an inspection apparatus of a semiconductor device according to the first embodiment.

FIG. 5 shows an enlargement of the head part 50 of the inspection apparatus 121. As shown in FIG. 5, the inspection apparatus 121 further includes a holder 65 (e.g., a first structure body 65a) in addition to the first probe 61, the conductive member 51, and the detector 70 (not illustrated in FIG. 5). The holder 65 (e.g., the first structure body 65a) is, for example, insulative. The holder 65 (e.g., the first structure body 65a) fixes the position of the first probe 61 with respect to the conductive member 51.

For example, the head part 50 includes the conductive member 51, the first probe 61, and the holder 65 (e.g., the first structure body 65a). The insulating layer 52 may be provided in the head part 50 as necessary.

In the example, the width w1 of the conductive member 51 is larger than a width w5 of the insulating layer 52. The width w5 is, for example, not less than 200 µm and not more than 1000 µm. A width w4 of the portion of the insulating layer 52 other than the first hole 50h is, for example, not less than 50 µm and not more than 500 mm. The widths w4 and w5 are lengths along one direction along the X-Y plane.

By setting the width w5 to be small, the region (the second portion 10b) where the conductive member voltage Vg is applied can be small.

As shown in FIG. 5, the side surface portion of the side surface of the conductive member 51 where the insulating layer 52 is provided may have a tapered configuration. Sufficient mechanical strength of the conductive member 51 is obtained while stably holding a small insulating layer 52. For example, the likelihood of contact between the conductive member 51 and an unevenness (including foreign matter, etc.) of the front surface of the semiconductor device 10 can be low.

Figure 6:
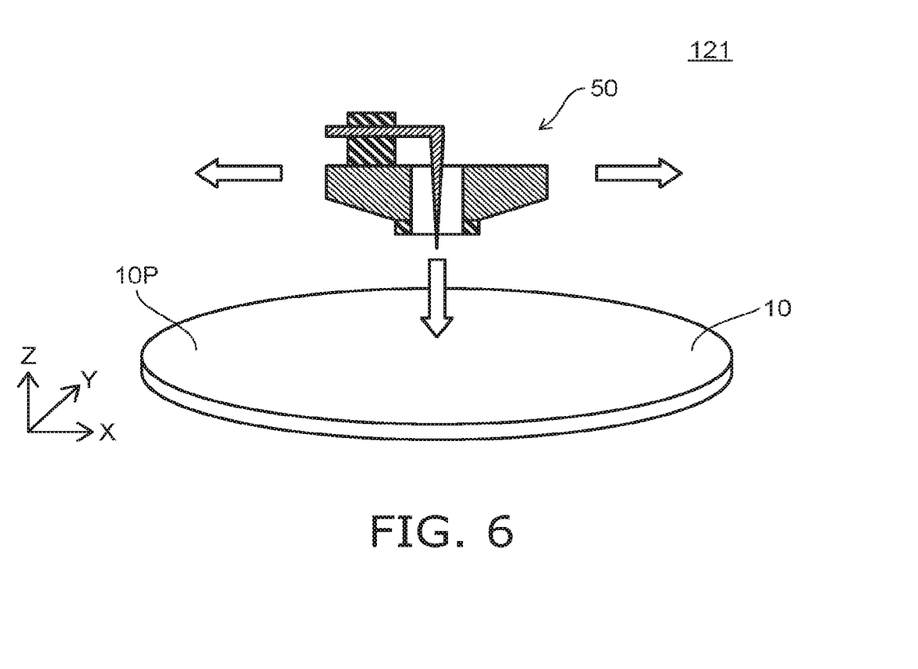
FIG. 6 is a schematic perspective view illustrating an operation of the inspection apparatus of the semiconductor device according to the first embodiment.

FIG. 6 is a schematic perspective view illustrating an operation of the inspection apparatus of the semiconductor device according to the first embodiment.

In the inspection apparatus 121 as shown in FIG. 6, the head part 50 is above the first surface 10P of the semiconductor device 10 (e.g., the wafer). The relative heights (the positions in the Z-axis direction) and the positions in the X-Y plane of the head part 50 and the first surface 10P are modifiable. The characteristics can be inspected at any position of the semiconductor device 10.

Thus, the relative positions of the semiconductor device 10 and the head part 50 including the first probe 61 and the conductive member 51 are changeable along the first surface 10P.

Figure 7A:
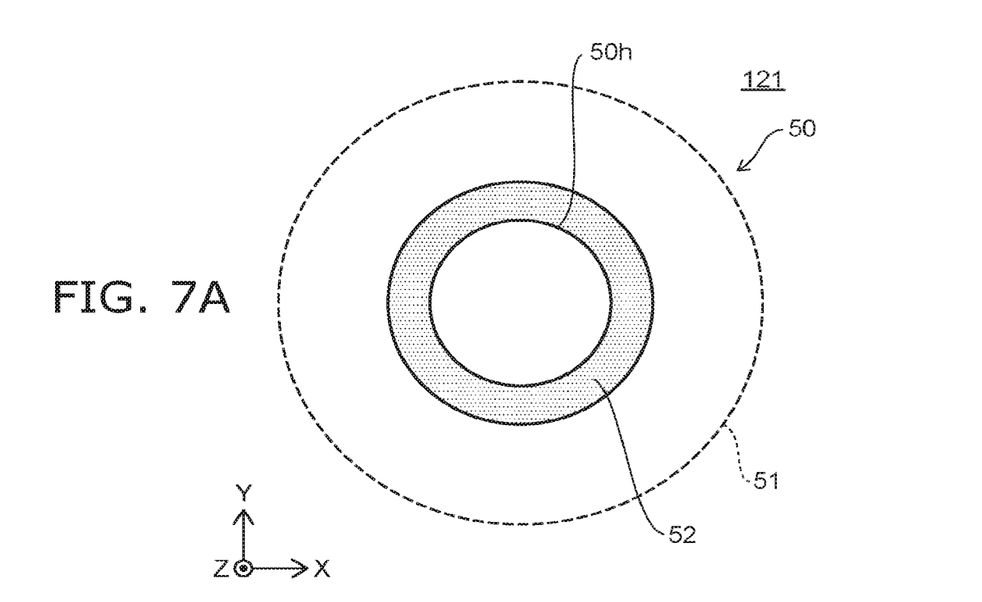
FIG. 7A and FIG. 7B are schematic plan views illustrating inspection apparatuses of semiconductor devices according to the first embodiment.
Figure 7B:
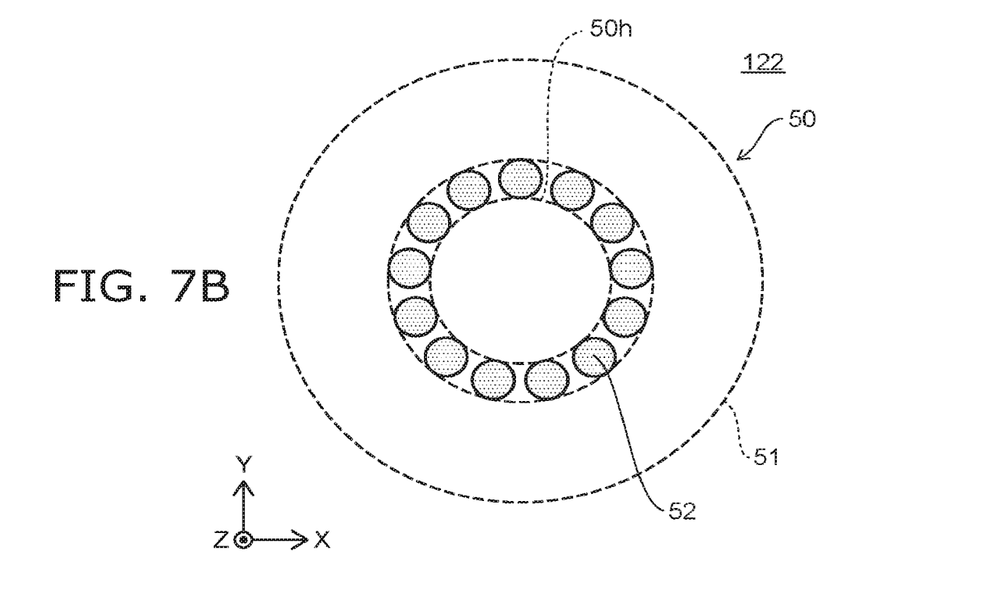

FIG. 7A and FIG. 7B are schematic plan views illustrating inspection apparatuses of semiconductor devices according to the first embodiment.

These drawings illustrate configurations (configurations in the X-Y plane) of the conductive member 51 and the insulating layer 52.

In the inspection apparatus 121 illustrated in FIG. 7A, the insulating layer 52 has a ring configuration.

In an inspection apparatus 122 illustrated in FIG. 7B, multiple insulating layers 52 are provided. The multiple insulating layers 52 are provided around the first hole 50h. In the case where the distance between the multiple insulating layers 52 is short, the carrier region 11E substantially disappears even at the portions of the semiconductor device 10 opposing the regions between the multiple insulating layers 52.

Figure 8A:
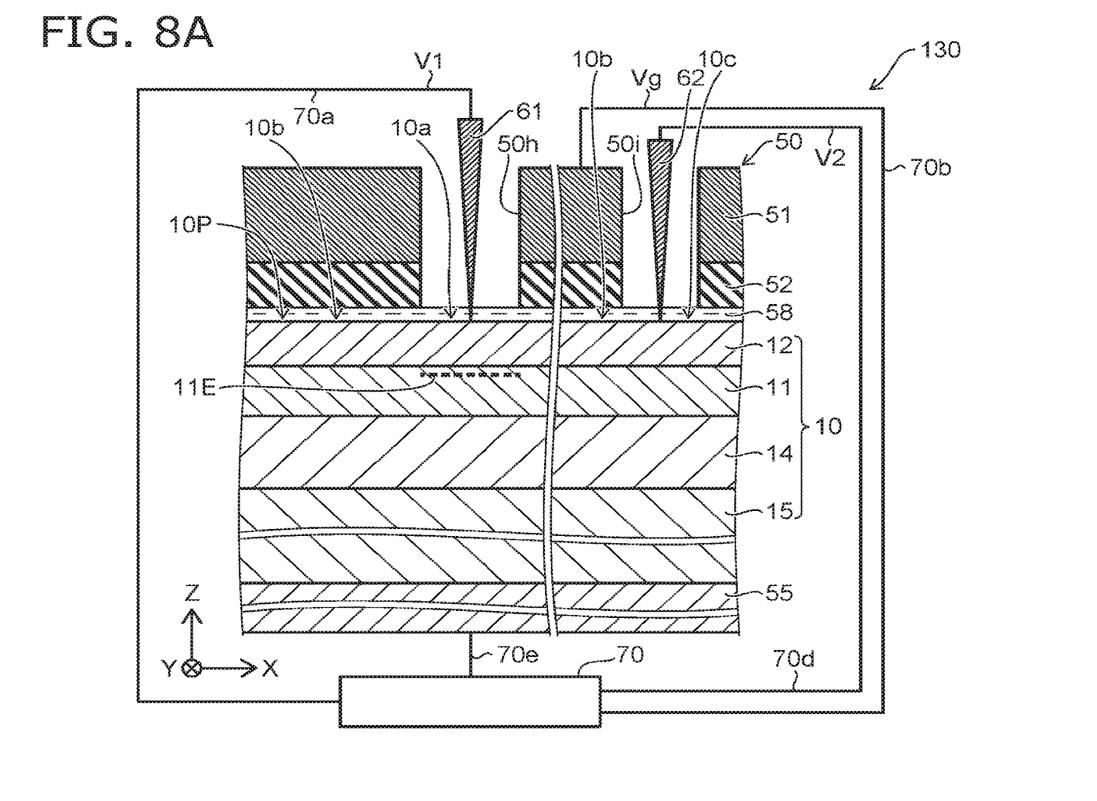
FIG. 8A and FIG. 8B are schematic views illustrating an inspection apparatus of a semiconductor device according to the first embodiment.
Figure 8B:
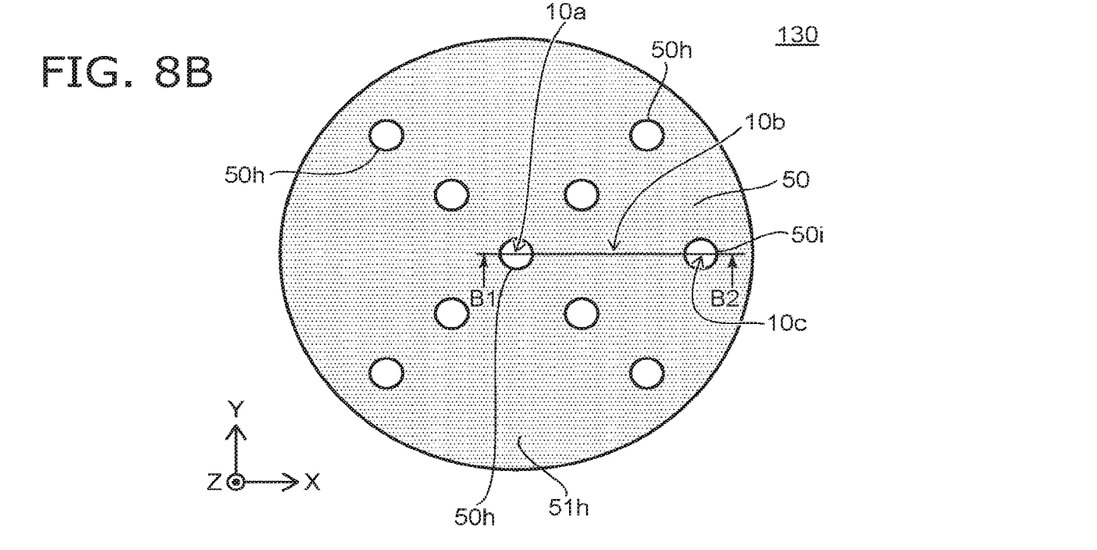

FIG. 8A and FIG. 8B are schematic views illustrating an inspection apparatus of a semiconductor device according to the first embodiment.

FIG. 8A is a line B1-B2 cross-sectional view of FIG. 8B. FIG. 8B is a plan view.

As shown in FIG. 8A, the inspection apparatus 130 includes a second probe 62 in addition to the first probe 61, the conductive member 51, and the detector 70. The second probe 62 is configured to contact a third portion 10c of the semiconductor device 10.

For example, the detector 70 is electrically connected to the second probe 62 by wiring 70d. When applying the first voltage V1 between the semiconductor device 10 and the first probe 61 and applying the conductive member voltage Vg between the semiconductor device 10 and the conductive member 51, the detector 70 applies a second voltage V2 between the semiconductor device 10 and the second probe 62. The second voltage V2 is between the first voltage V1 and the conductive member voltage Vg.

For example, the absolute value of the second voltage V2 is less than the absolute value of the first voltage V1. For example, the absolute value of the second voltage V2 is less than the absolute value of the conductive member voltage Vg. The second voltage V2 is, for example, 0 volts. By applying the second voltage V2, the characteristics of the semiconductor device 10 can be inspected more stably.

As shown in FIG. 8A and FIG. 8B, at least a portion of the second portion 10b is between the first portion 10a and the third portion 10c.

As shown in FIG. 8A, for example, the conductive member 51 has the first hole 50h and a second hole 50i. The first probe 61 is configured to contact the first portion 10a via the first hole 50h. The second probe 62 is configured to contact the third portion 10c via the second hole 50i.

As shown in FIG. 8B, the multiple first holes 50h may be provided. In the example, the number of the second holes 50i is 1. Multiple second holes 50i may be provided. Multiple first holes 50h may be provided; and one of the multiple first holes 50h may be considered to be the second hole 50i.

Figure 9:
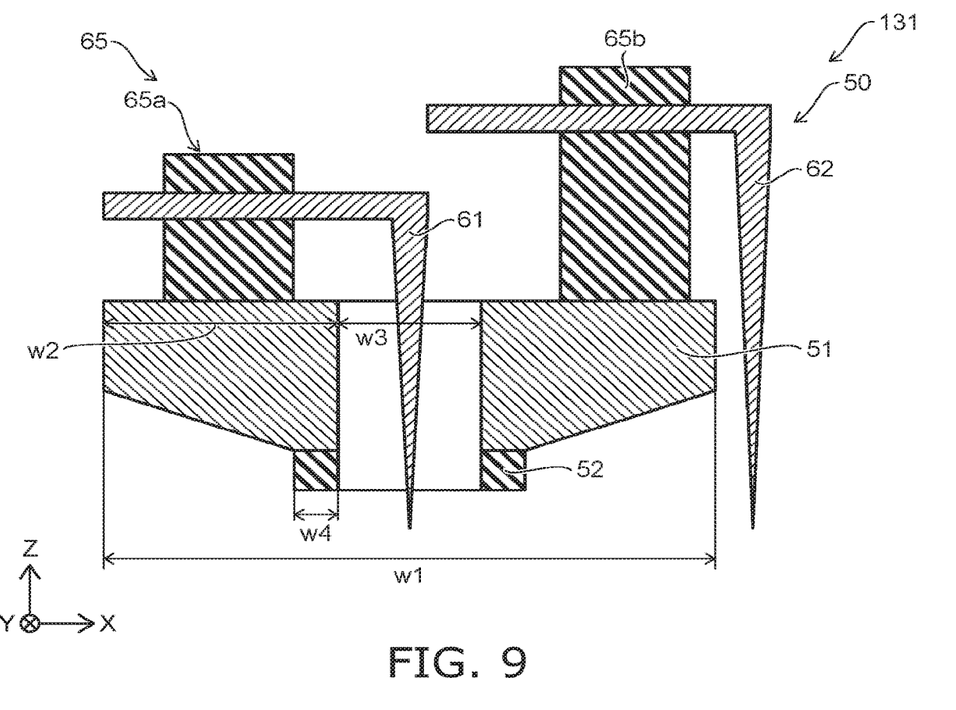
FIG. 9 is a schematic cross-sectional view illustrating a portion of an inspection apparatus of a semiconductor device according to the first embodiment.

FIG. 9 is a schematic cross-sectional view illustrating a portion of an inspection apparatus of a semiconductor device according to the first embodiment.

FIG. 9 shows an enlargement of the head part 50 of the inspection apparatus 131. As shown in FIG. 9, the inspection apparatus 131 further includes the holder 65 in addition to the first probe 61, the second probe 62, the conductive member 51, and the detector 70 (not illustrated in FIG. 9). The holder 65 may include, for example, the first structure body 65a and a second structure body 65b. The second structure body 65b may be continuous with the first structure body 65a. The holder 65 (the first structure body 65a and the second structure body 65b) is, for example, insulative. The holder 65 (e.g., the first structure body 65a) fixes the position of the first probe 61 with respect to the conductive member 51. The holder 65 (e.g., the second structure body 65b) fixes the position of the second probe 62 with respect to the conductive member 51.

For example, the first probe 61, the second probe 62, the conductive member 51, the first structure body 65a, and the second structure body 65b are included in the head part 50.

Figure 10:
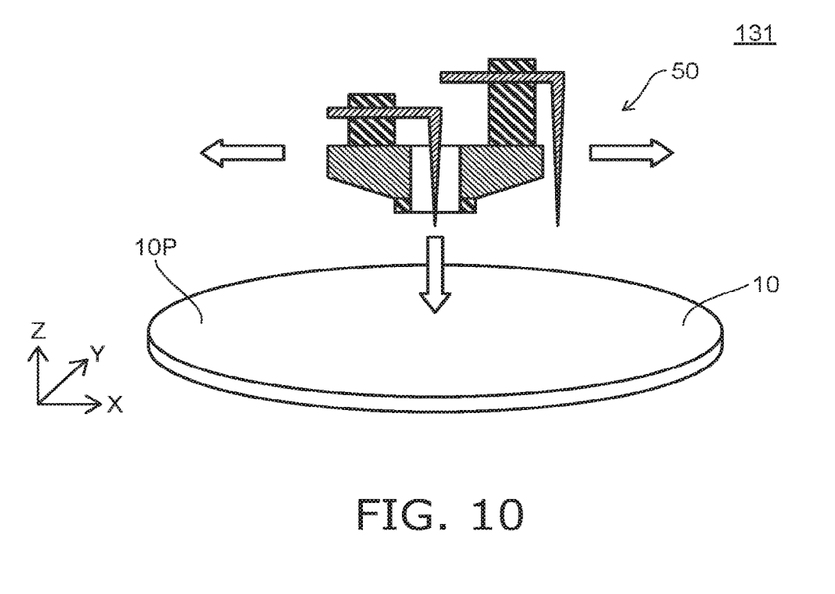
FIG. 10 is a schematic perspective view illustrating an operation of the inspection apparatus of the semiconductor device according to the first embodiment.

FIG. 10 is a schematic perspective view illustrating an operation of the inspection apparatus of the semiconductor device according to the first embodiment.

In the inspection apparatus 131 as shown in FIG. 10, the head part 50 is above the first surface 10P of the semiconductor device 10 (e.g., the wafer). The relative heights (the positions in the Z-axis direction) and the positions in the X-Y plane of the head part 50 and the first surface 10P are modifiable. The characteristics can be inspected at any position of the semiconductor device 10.

Thus, the relative positions of the semiconductor device 10 and the head part 50 including the first probe 61, the second probe 62, and the conductive member 51 are changeable along the first surface 10P.

Figure 11:
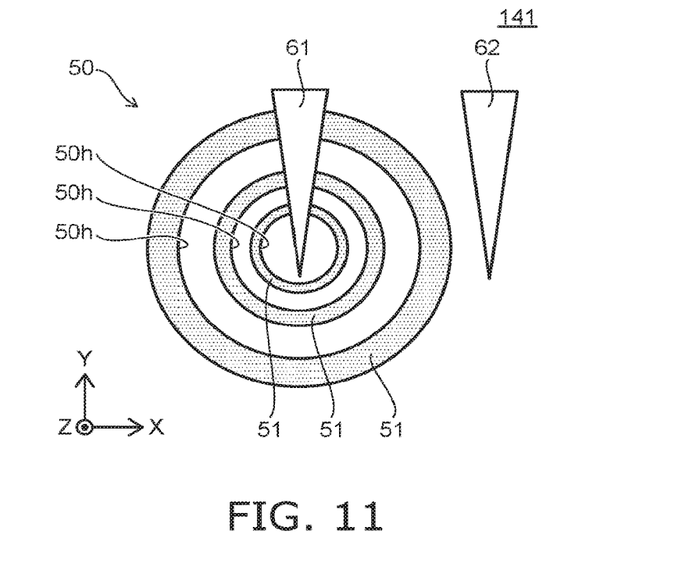
FIG. 11 is a schematic plan view illustrating an inspection apparatus of a semiconductor device according to the first embodiment.

FIG. 11 is a schematic plan view illustrating an inspection apparatus of a semiconductor device according to the first embodiment. FIG. 11 illustrates the configuration (the configuration in the X-Y plane) of the conductive member 51. As shown in FIG. 11, the conductive member 51 may have multiple holes. For example, the multiple holes are concentric. For example, one of the multiple first holes 50h is around another one of the multiple first holes 50h. For example, the conductive member voltage Vg is applied while being switched between the multiple circular portions of the conductive member 51. For example, the current in regions having different surface areas can be measured easily. For example, the characteristics can be inspected for different surface areas in a short period of time. For example, the current can be measured in regions having different surface areas by one contact of the first probe 61 and the semiconductor device 10. Therefore, for example, the occurrence of dirt or scratches at the front surface of the semiconductor device 10 can be suppressed.

Figure 12:
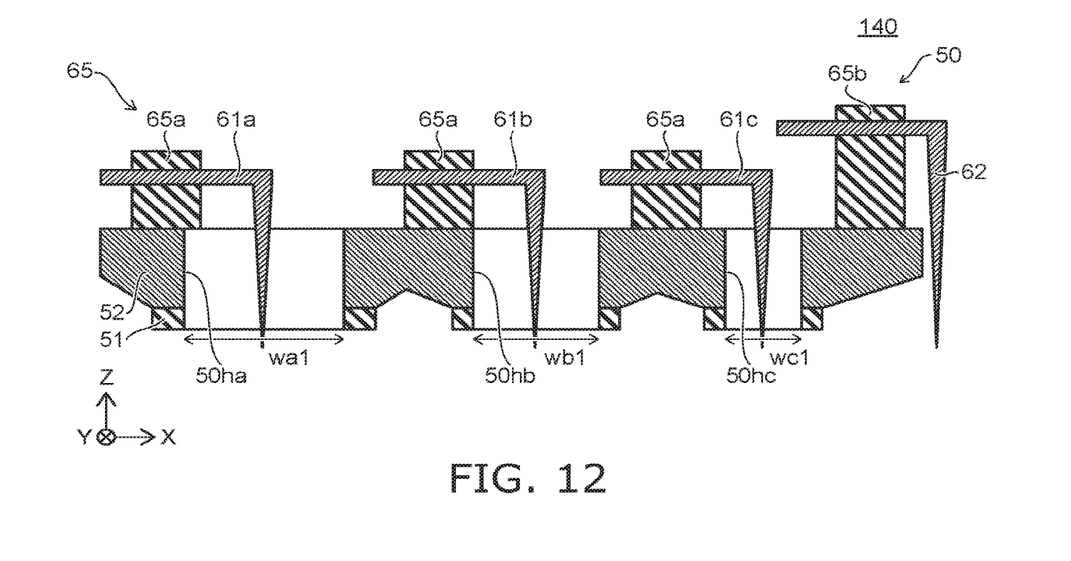
FIG. 12 is a schematic plan view illustrating an inspection apparatus of a semiconductor device according to the first embodiment.

FIG. 12 is a schematic plan view illustrating an inspection apparatus of a semiconductor device according to the first embodiment. As shown in FIG. 12, multiple first probes (probes 61a, 61b, 61c, etc.) and the second probe 62 are provided in the inspection apparatus 140. The conductive member 51 has multiple first holes (holes 50ha, 50hb, 50hc, etc.). At least a portion of the probe 61a enters the hole 50ha. At least a portion of the probe 61b enters the hole 50hb. At least a portion of the probe 61c enters the hole 50hc.

The holder 65 is provided in the example. The holder 65 includes the first structure body 65a and the second structure body 65b. Multiple first structure bodies 65a are provided in the example. The first structure bodies 65a fix the positions of the multiple first probes (the probes 61a, 61b, 61c, etc.) with respect to the conductive member 51. The second structure body 65b fixes the position of the second probe 62 with respect to the conductive member 51.

The semiconductor device 10 (e.g., the wafer) can be inspected by placing the head part 50 having such a configuration at any position of the first surface 10P of the semiconductor device 10.

For example, a width wa1 of the hole 50ha is larger than a width wb1 of the hole 50hb. The width wb1 of the hole 50hb is larger than a width wc1 of the hole 50hc. These widths are lengths along one direction along the Z-Y plane. For example, the width wa1 is not less than 750 μm and not more than 1500 μm. For example, the width wb1 is not less than 250 μm but less than 750 μm. For example, the width wc1 is not less than 10 μm but less than 250 μm.

By using such multiple holes having different widths, the inspection for different surface areas can be performed efficiently.

Second Embodiment

The embodiment relates to a method for inspecting the semiconductor device 10. The head part 50 (e.g., referring to FIG. 1A) is used in the inspection method. The head part 50 includes the first probe 61 and the conductive member 51 (e.g., referring to FIG. 1A). The first probe 61 is configured to contact the first portion 10a of the semiconductor device 10. The conductive member 51 is configured to oppose the second portion of the semiconductor device 10. By using such a head part 50 in the inspection method, the first voltage V1 is applied between the semiconductor device 10 and the first probe 61; the conductive member voltage Vg is applied between the semiconductor device 10 and the conductive member 51; and the current that flows in the first probe 61 is detected. The first voltage V1 has the first polarity of one of positive or negative when referenced to the potential of the semiconductor device 10. The conductive member voltage Vg has the second polarity of the other of positive or negative when referenced to the potential of the semiconductor device 10.

By applying such a conductive member voltage Vg, the carrier region 11E in the second portion 10b can disappear locally. The characteristics of the first portion 10a can be inspected in a state in which the effects of the second portion 10b are suppressed. According to the embodiment, a method for inspecting can be provided in which an efficient inspection of the semiconductor device can be performed.

The configuration described in reference to the first embodiment is applicable to the second embodiment. For example, the head part 50 may include the insulating layer 52. The insulating layer 52 is between the second portion 10b and the conductive member 51 when the conductive member 51 opposes the second portion 10b. For example, the second probe 62 also may be provided. The second voltage V2 recited above may be applied by the second probe 62.

In the embodiment, the application of 0 volts also is included in "a voltage being applied".

According to the embodiments, an inspection apparatus of a semiconductor device and a method for inspecting the semiconductor device can be provided in which an efficient inspection can be performed.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in inspection apparatuses such as probes, conductive members, detectors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all inspection apparatuses of semiconductor devices, and methods for inspecting semiconductor devices practicable by an appropriate design modification by one skilled in the art based on the inspection apparatuses of the semiconductor devices, and the methods for inspecting semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An inspection apparatus of a semiconductor device, comprising:
    a first probe configured to contact a first portion of the semiconductor device;
    a conductive member configured to oppose a second portion of the semiconductor device; and
    a detector configured to apply a first voltage between the semiconductor device and the first probe, to apply a conductive member voltage between the semiconductor device and the conductive member, and to detect a current flowing in the first probe,
    the first voltage having a first polarity of one of positive or negative when referenced to a potential of the semiconductor device,
    the conductive member voltage having a second polarity of the other of positive or negative when referenced to the potential of the semiconductor device,
    wherein
    the conductive member includes a first hole, and
    the first probe is configured to contact the first portion via the first hole.

2. The apparatus according to claim 1, wherein the first polarity is positive, and the second polarity is negative.

3. The apparatus according to claim 1, wherein the detector detects the current while changing an absolute value of the first voltage.

4. The apparatus according to claim 1, further comprising a stage,
    the semiconductor device being placed between the stage and the conductive member,
    the detector is configured to apply the conductive member voltage between the semiconductor device and the conductive member via the stage and to apply the first voltage between the semiconductor device and the first probe via the stage.

5. The apparatus according to claim 1, further comprising a second probe configured to contact a third portion of the semiconductor device,
    when applying the first voltage between the semiconductor device and the first probe and applying the conductive member voltage between the semiconductor device and the conductive member, the detector applies a second voltage between the semiconductor device and the second probe, the second voltage being between the first voltage and the conductive member voltage.

6. The apparatus according to claim 5, wherein at least a portion of the second portion is between the first portion and the third portion.

7. An inspection apparatus of a semiconductor device, comprising:
    a first probe configured to contact a first portion of the semiconductor device;
    a conductive member configured to oppose a second portion of the semiconductor device;
    a detector configured to apply a first voltage between the semiconductor device and the first probe, to apply a conductive member voltage between the semiconductor device and the conductive member, and to detect a current flowing in the first probe,
    a second probe,
    the first voltage having a first polarity of one of positive or negative when referenced to a potential of the semiconductor device,
    the conductive member voltage having a second polarity of the other of positive or negative when referenced to the potential of the semiconductor device,
    the second probe being configured to contact a third portion of the semiconductor device,
    when applying the first voltage between the semiconductor device and the first probe and applying the conductive member voltage between the semiconductor device and the conductive member, the detector applies a second voltage between the semiconductor device and the second probe, the second voltage being between the first voltage and the conductive member voltage,
    wherein
    the conductive member includes a first hole and a second hole, the first probe is configured to contact the first portion via the first hole, and the second probe is configured to contact the third portion via the second hole.

8. The apparatus according to claim 5, further comprising a holder, the holder being configured to fix a position of the first probe with respect to the conductive member and to fix a position of the second probe with respect to the conductive member.

9. The apparatus according to claim 1, further comprising an insulating layer, the insulating layer being between the second portion and the conductive member when the conductive member opposes the second portion.

10. An inspection apparatus of a semiconductor device, comprising:

a first probe configured to contact a first portion of the semiconductor device;

a conductive member configured to oppose a second portion of the semiconductor device; and a detector configured to apply a first voltage between the semiconductor device and the first probe, to apply a conductive member voltage between the semiconductor device and the conductive member, and to detect a current flowing in the first probe, an insulating layer, the first voltage having a first polarity of one of positive or negative when referenced to a potential of the semiconductor device, the conductive member voltage having a second polarity of the other of positive or negative when referenced to the potential of the semiconductor device, the insulating layer being between the second portion and the conductive member when the conductive member opposes the second portion, wherein the conductive member includes a plurality of first holes.

11. The apparatus according to claim 10, wherein one of the plurality of first holes is around an other one of the plurality of first holes.

12. The apparatus according to claim 9, further comprising a second probe configured to contact a third portion of the semiconductor device.

13. The apparatus according to claim 12, wherein at least a portion of the second portion is between the first portion and the third portion.

14. The apparatus according to claim 1, wherein the semiconductor device has a first surface including the first portion and the second portion, and relative positions of the semiconductor device and a head part are changeable along the first surface, the head part including the first probe and the conductive member.

15. A method for inspecting a semiconductor device, comprising using a head part to apply a first voltage between the semiconductor device and a first probe, to apply a conductive member voltage between the semiconductor device and a conductive member, and to detect a current flowing in the first probe, the head part including the first probe and the conductive member, the first probe being configured to contact a first portion of the semiconductor device, the conductive member being configured to oppose a second portion of the semiconductor device;

the first voltage having a first polarity of one of positive or negative when referenced to a potential of the semiconductor device, the conductive member voltage having a second polarity of the other of positive or negative when referenced to the potential of the semiconductor device, wherein the conductive member includes a first hole, and the first probe is configured to contact the first portion via the first hole.

16. The method according to claim 15, wherein the head part further includes an insulating layer, and the insulating layer is between the second portion and the conductive member when the conductive member opposes the second portion.

* * * * *